(12) United States Patent
Kim et al.

(10) Patent No.: US 9,847,366 B1
(45) Date of Patent: Dec. 19, 2017

(54) INFRARED IMAGE SENSOR

(71) Applicant: SILICON DISPLAY TECHNOLOGY, Yongin-si (KR)

(72) Inventors: Jaemin Kim, Gyeongsan-si (KR); Kijoong Kim, Suwon-si (KR); Jin Hyeong Yu, Dangjin-si (KR); Ji Ho Hur, Yongin-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 0 days.

(21) Appl. No.: 15/610,761

(22) Filed: Jun. 1, 2017

(30) Foreign Application Priority Data

Dec. 14, 2016 (KR) .................. 10-2016-0170559

(51) Int. Cl.
*H01L 27/14* (2006.01)
*H01L 27/146* (2006.01)
*H01L 27/30* (2006.01)
*G01J 1/42* (2006.01)
*G01J 1/58* (2006.01)

(52) U.S. Cl.
CPC ...... *H01L 27/14649* (2013.01); *G01J 1/4228* (2013.01); *G01J 1/58* (2013.01); *H01L 27/14607* (2013.01); *H01L 27/14616* (2013.01); *H01L 27/14625* (2013.01); *H01L 27/14629* (2013.01); *H01L 27/14636* (2013.01); *H01L 27/307* (2013.01)

(58) Field of Classification Search
CPC ......... H01L 27/14649; H01L 27/14625; H01L 27/14607; H01L 27/14636; H01L 27/307; H01L 27/14616; H01L 27/14629; G01J 1/58; G01J 1/4228

USPC ...................................... 250/338.4
See application file for complete search history.

(56) References Cited

U.S. PATENT DOCUMENTS

| 4,857,228 A * | 8/1989 | Kabay ............. C09K 11/7731 250/484.4 |
| 2006/0186363 A1* | 8/2006 | Hazelwood ....... H01L 27/14806 250/580 |
| 2010/0320387 A1* | 12/2010 | Garber ............. H01L 31/03762 250/338.4 |
| 2014/0217284 A1* | 8/2014 | So ................... H01L 51/4213 250/330 |
| 2017/0040385 A1* | 2/2017 | Li .................... H01L 27/322 |

FOREIGN PATENT DOCUMENTS

KR  10-2016-0036249  4/2016

* cited by examiner

*Primary Examiner* — David Porta
*Assistant Examiner* — Gisselle Gutierrez
(74) *Attorney, Agent, or Firm* — Lex IP Meister, PLLC

(57) ABSTRACT

An exemplary embodiment of the present invention provides an infrared image sensor including: a sensor pixel connected with a data lead-out line and a scan line disposed on a surface of a substrate; a wavelength converter positioned in the sensor pixel and disposed in an internal movement path of infrared rays, including an anti-Stokes material that absorbs infrared rays and converts them into visible rays to emit them; and a photosensor part positioned in the sensor pixel to sense the visible rays converted by the wavelength converter.

20 Claims, 11 Drawing Sheets

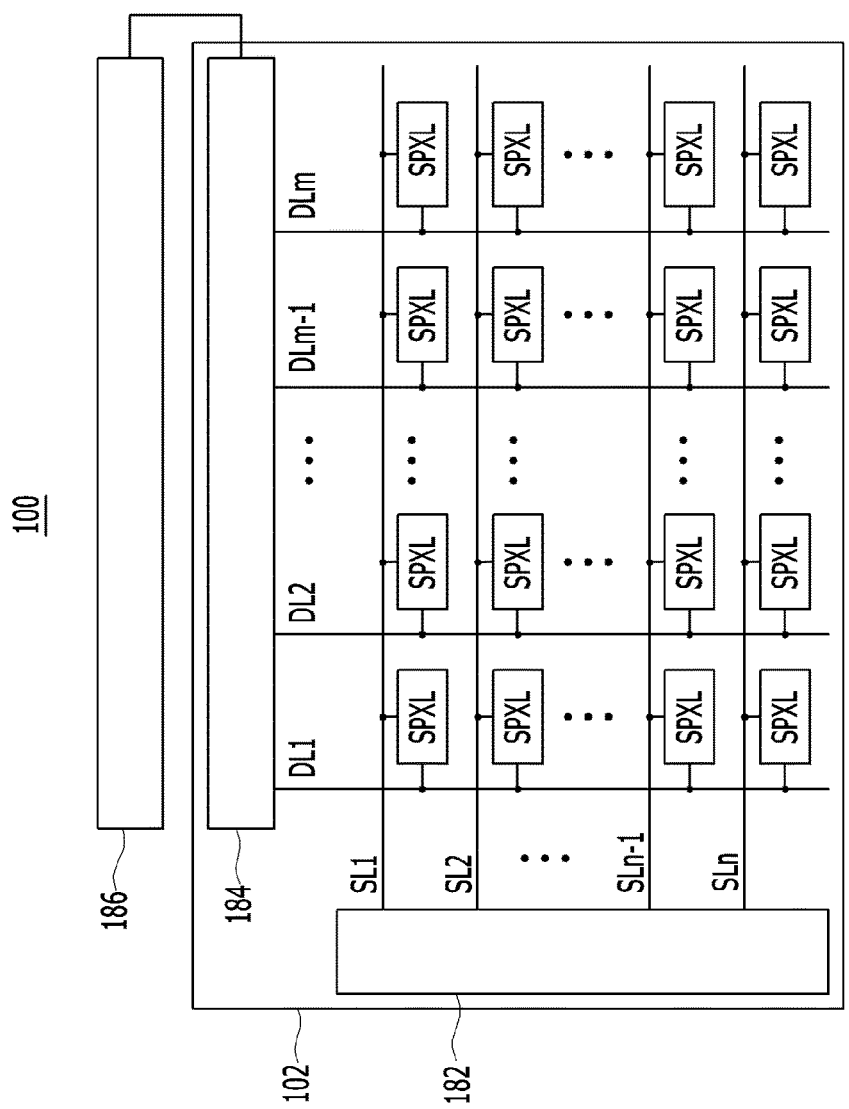

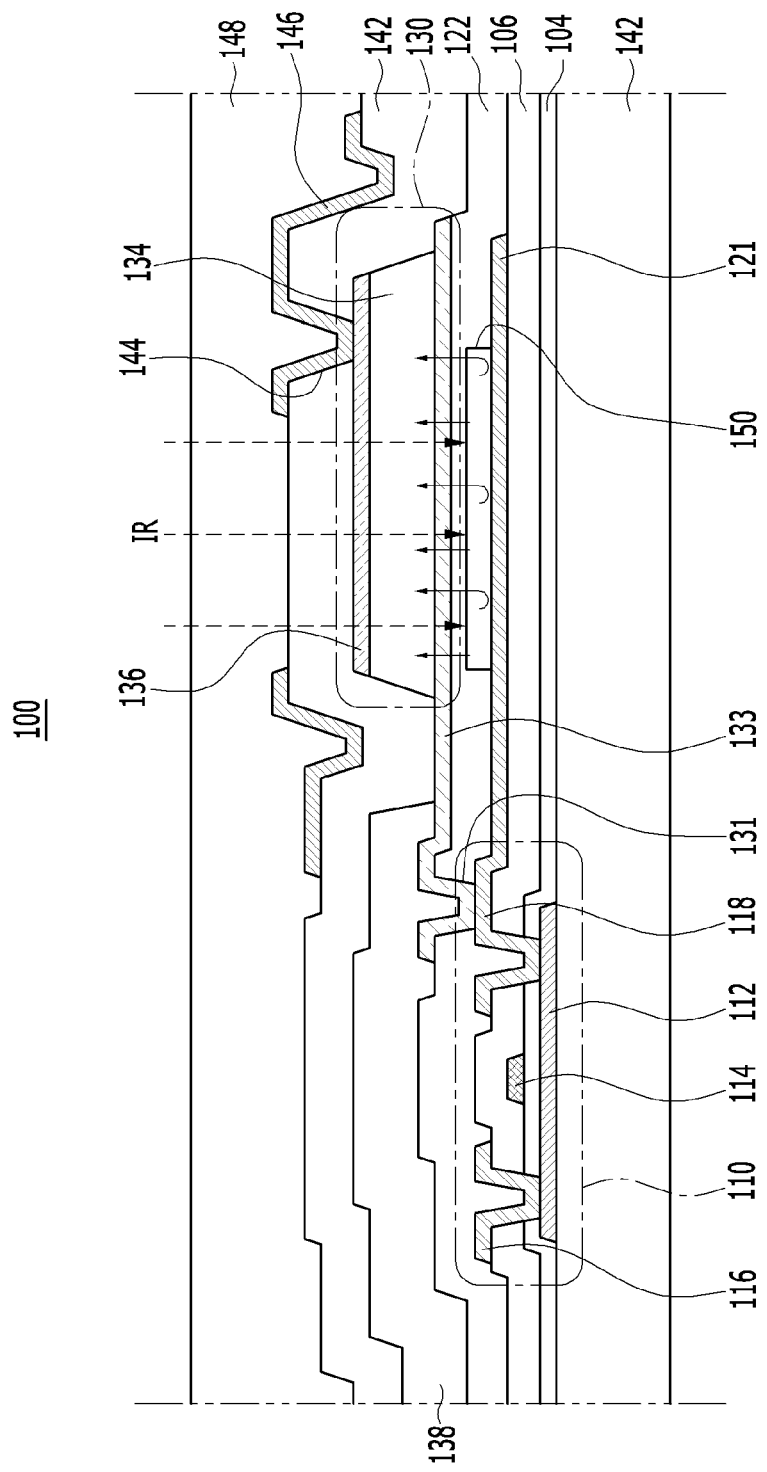

INFRARED IMAGE SENSOR

CROSS-REFERENCE TO RELATED APPLICATION

This application claims priority to and the benefit of Korean Patent Application No. 10-2016-0170559 filed in the Korean Intellectual Property Office on Dec. 14, 2016, the entire contents of which are incorporated herein by reference.

BACKGROUND OF THE INVENTION (a) Field of the Invention

This relates to an infrared image sensor.

(b) Description of the Related Art

An image sensor is a device that acquires an image by using a property of a semiconductor to react with light. Recently, with development of computer industries and communication industries, image sensors having improved performance in various fields such as digital cameras, scanners, camcorders, personal communication systems (PCS), game devices, light cameras, and medical micro cameras have been used.

In Korean Patent Publication No. 10-2016-0036249 relating to an image sensor using infrared rays, the image sensor disclosed therein includes: a backlight unit; a visible ray conversion unit for converting ultraviolet rays into visible rays; and a photosensor part for sensing visible rays reflected by the object from the backlight unit, infrared rays, and visible rays converted by the visible ray conversion unit.

However, semiconductor materials used to absorb light of an infrared wavelength band in an infrared image sensor have small bandgaps, and thus a dark current may be generated by thermally excited electrons. This dark current acts as noise in the image sensor, and thus an image visibility of the sensor may be deteriorated. Thus, in order to minimize the occurrence of dark current, a conventional infrared image sensor can be driven at a low temperature of about 170 K or less.

The above information disclosed in this Background section is only for enhancement of understanding of the background of the invention and therefore it may contain information that does not form the prior art that is already known in this country to a person of ordinary skill in the art.

SUMMARY OF THE INVENTION

An exemplary embodiment of the present invention may provide an image sensor for minimizing a dark current by converting infrared rays into visible rays and using a semiconductor material that is operated in a visible ray wavelength band.

An exemplary embodiment of the present invention may provide an image sensor for improving visibility of an acquired image.

An exemplary embodiment of the present invention may provide an image sensor which can be operated without using an additional cooling process.

An exemplary embodiment of the present invention can be used to achieve other effects that are not described in detail in addition to the aforementioned effects.

An exemplary embodiment of the present invention provides an infrared image sensor including: a sensor pixel connected with a data lead-out line and a scan line disposed on a surface of a substrate; a wavelength converter positioned in the sensor pixel and disposed in an internal movement path of infrared rays, including an anti-Stokes material that absorbs infrared rays and converts them into visible rays to emit them; and a photosensor part positioned in the sensor pixel to sense the visible rays converted by the wavelength converter.

Herein, the photosensor part may include: a first electrode and a second electrode separately disposed to face each other; and a semiconductor layer disposed between the first electrode and the second electrode to transmit infrared rays and absorb visible rays.

The infrared image sensor may further include: a thin film transistor connected to the scan line and the data lead-out line to transfer current signals depending on charge generation of the photosensor part to the data lead-out line.

The first electrode may be formed by allowing a source electrode or a drain electrode of the thin film transistor to extend.

The second electrode may include a transparent material.

The infrared image sensor may further include a third electrode positioned on the second electrode of the photosensor part to be connected with the second electrode through a contact hole, the wavelength converter may be positioned at a same layer as the third electrode, and the wavelength converter overlaps the semiconductor layer.

The anti-Stokes material may include a plurality of anti-Stokes nanoparticles, and the anti-Stokes nanoparticles may be uniformly dispersed inside the wavelength converter.

The wavelength converter may be positioned in the semiconductor layer, the anti-Stokes material may include a plurality of anti-Stokes nanoparticles, and the anti-Stokes nanoparticles may be uniformly dispersed inside the semiconductor layer.

The first electrode may be disposed on a source electrode or a drain electrode of the thin film transistor, and the first electrode may be connected with the source electrode or the drain electrode of the thin film transistor through a contact hole.

Each of the first electrode and the second electrode may include a transparent material.

The infrared image sensor may further include a reflection electrode formed by allowing the source electrode or the drain electrode of the thin film transistor to extend, the wavelength converter may be positioned between the reflection electrode and the first electrode, and the wavelength converter may overlap the semiconductor layer.

The anti-Stokes material may include a plurality of anti-Stokes nanoparticles, and the anti-Stokes nanoparticles may be uniformly dispersed inside the wavelength converter.

Some of visible rays emitted from the wavelength converter may be reflected by the reflection electrode to be introduced into the semiconductor layer.

The wavelength converter may further include a down-conversion material for absorbing ultraviolet rays, converting them into visible rays, and emitting them.

The down-conversion material may include a plurality of down-conversion nanoparticles, and the down-conversion nanoparticles may be uniformly dispersed inside the wavelength converter.

The semiconductor layer may include an amorphous silicon (a-Si), a polysilicon, a group III-V semiconductor material, a group II-VI semiconductor material, a group III-V ternary semiconductor material, a group II-VI ternary semiconductor material, copper indium gallium selenide (CIGS), an organic material, or quantum dots.

The group III-V semiconductor material may include at least one of GaN and GaAs, the group II-VI semiconductor material may include at least one of CdS, ZnS, CdTe, and HgTe, the group III-V ternary semiconductor material may include InGaAs, and the group II-VI ternary semiconductor material may include HgCdTe.

The infrared image sensor may further include a backlight unit positioned on a second surface of the substrate to emit infrared rays to an object, the photosensor part and the wavelength converter may be positioned between the backlight unit and the object, and the infrared rays may be reflected in the object to be emitted to the wavelength converter.

The thin film transistor may have one of a co-planar structure, a staggered structure, an inverted co-planar structure, and an inverted staggered structure.

A channel layer of the thin film transistor may include a low temperature polycrystalline silicon (LTPS), an amorphous silicon (a-Si), or an oxide.

The infrared image sensor may further include: a scan line driver configured to drive the scan line; and a lead-out controller configured to supply a current signal of the photosensor to a lead-out driver through the data lead-out line.

According to the exemplary embodiment of the present invention, the infrared image sensor may minimize dark currents by converting infrared rays into visible rays and using a semiconductor material that is operated in a wavelength band of visible rays, to improve image visibility, and may be operated without using an additional cooling process

BRIEF DESCRIPTION OF THE DRAWINGS

FIG. 1A is a drawing for describing a general driving method of an infrared image sensor according to an exemplary embodiment.

FIG. 6A illustrates a cross-section of an infrared image sensor according to an exemplary embodiment.

DETAILED DESCRIPTION OF THE EMBODIMENTS

Figure 1B:
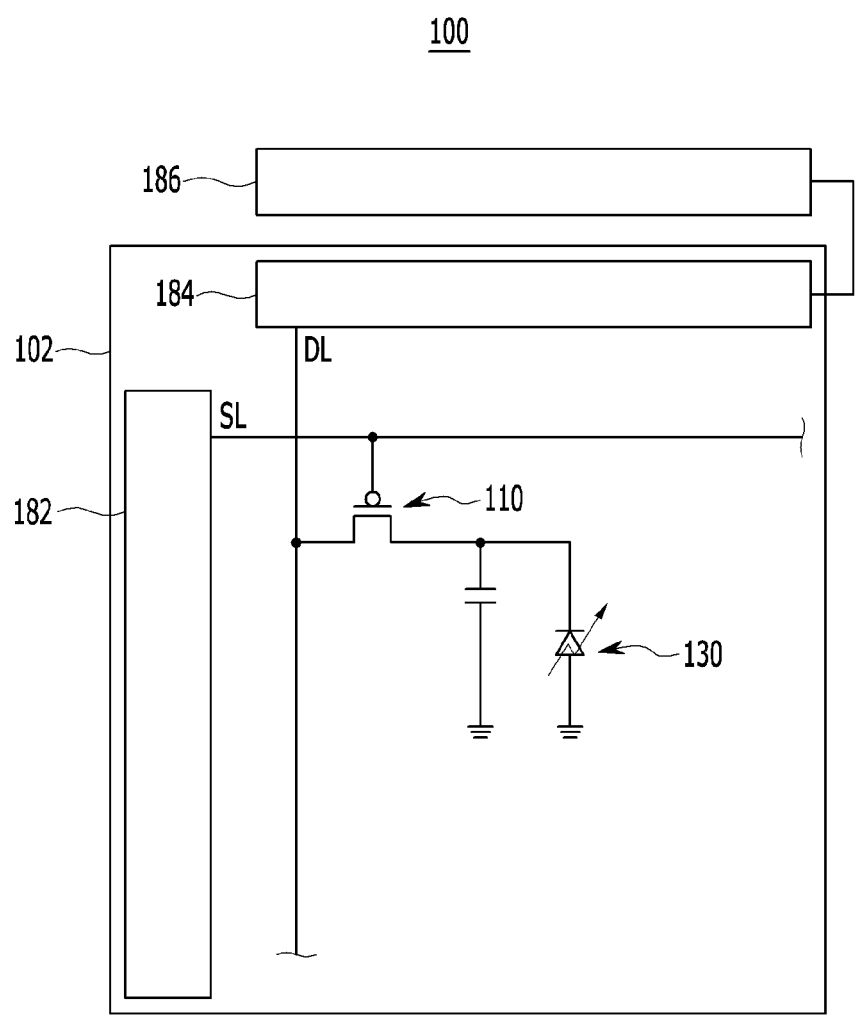
FIG. 1B illustrates a driving method of a pixel of one of infrared image sensors of FIG. 1A.

The present invention will be described more fully hereinafter with reference to the accompanying drawings, in which exemplary embodiments of the invention are illustrated. As those skilled in the art would realize, the described embodiments may be modified in various different ways, all without departing from the spirit or scope of the present invention. Accordingly, the drawings and description are to be regarded as illustrative in nature and not restrictive, and like reference numerals designate like elements throughout the specification. Further, detailed description of a well-known related art will be omitted.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In the meantime, when an element is referred to as being "directly on" another element, there are no intervening elements present. In contrast, it will be understood that when an element such as a layer, film, region, or substrate is referred to as being "under" another element, it can be directly below the other element or intervening elements may also be present. Further, when an element is referred to as being "directly below" another element, there are no intervening elements present.

In addition, unless explicitly described to the contrary, the word "comprise" and variations such as "comprises" or "comprising" will be understood to imply the inclusion of stated elements but not the exclusion of any other elements.

FIG. 1A is a drawing for describing a general driving method of an infrared image sensor according to an exemplary embodiment, and FIG. 1B illustrates a driving method of a pixel of one of infrared image sensors of FIG. 1A.

Referring to FIG. 1A and FIG. 1B, the infrared image sensor 100 includes a plurality of scan lines SL1 to SLn, and a plurality of data lead-out lines DL1 to DLm disposed on a substrate 102. Herein, a plurality of scan lines SL1 to SLn are disposed in parallel, and a plurality of data lead-out lines DL1 to DLm are disposed in parallel. The scan lines SL1 to SLn and the data lead-out lines DL1 to DLm cross each other, and a sensor pixel SPXL is defined at each crossing point thereof. Alternatively, a plurality of sensor pixels SPXL may be connected in common with one scan line SL or one data lead-out line DL.

The sensor pixels SPXL may be electrically connected to a plurality of scan lines SL1 to SLn and a plurality of data lead-out lines DL1 to DLm to include thin film transistors (TFT) 110 for switching the sensor pixels SPXL and a photosensor part 130 electrically connected to the thin film transistors 110.

A gate electrode of the thin film transistor 110 is connected with a scan line SL, a source electrode or a drain electrode thereof is connected with a data lead-out line DL, and the drain electrode or the source electrode is electrically connected to the photosensor part 130. Herein, two electrodes included in the photosensor part 130 may form a capacitor.

According to exemplary embodiments, the photosensor part 130 can transmit infrared light as it is and can absorb visible rays.

The infrared image sensor 100 may include a scan line driver 182 for driving a plurality of scan lines SL1 to SLn, and a lead-out controller 184 and a lead-out driver 186 for driving a plurality of data lead-out lines DL1 to DLm.

The scan line driver 182 supplies a gate signal to the scan line SL. The scan line driver 182 may select the scan line SL of the sensor pixel SPXL through which an image is detected, and the thin film transistor 110 may be turned on. Although not shown, the scan line driver 182 may include a shift register for generating a gate signal for sequentially supplying it to the thin film transistor 110, and a level shifter for performing a level-shift operation on the gate signal supplied to the sensor pixel SPXL as a high voltage that is necessary for the switching.

The lead-out controller 184 and the lead-out driver 186 detect current signals generated in the sensor pixel SPXL selected by the gate signal. Although not illustrated, the lead-out controller 184 may include a multiplexer for selecting one of a plurality of data lead-out lines DL1 to DLm to output it to the lead-out driver 186, a shift register for generating a switching signal of the multiplexer, and a level shifter for boosting an output voltage from the shift register.

When light of a visible ray wavelength band reaches the photosensor part 130 to generate a current signal depending on charge generation, charges may be stored in a capacitor. Further, when the thin film transistor 110 is turned on, the stored charges may be transmitted to the data lead-out line DL through the thin film transistor 110 and may be transmitted to the lead-out driver 186 by the lead-out controller 184. However, when light of an infrared ray wavelength band reaches the photosensor part 130, no charge may be generated, and infrared rays may be transmitted therethrough as they are.

Figure 2:
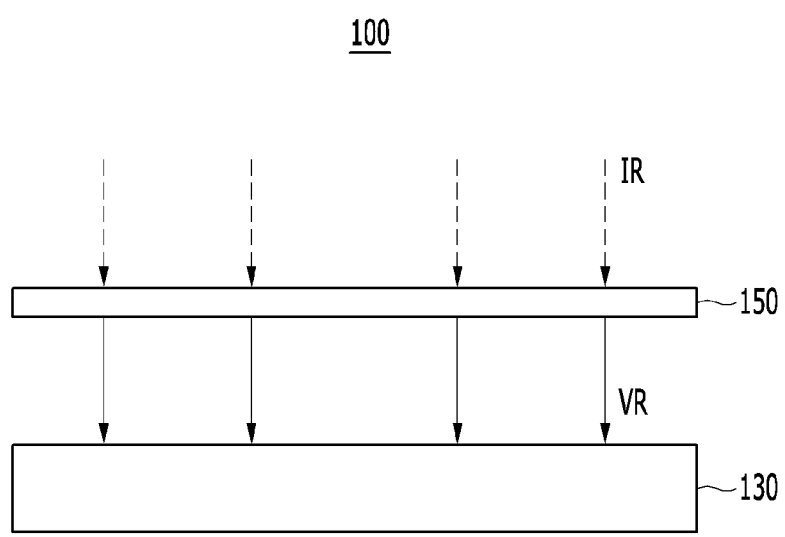
FIG. 2 schematically illustrates a cross-section of an infrared image sensor according to an exemplary embodiment.
Figure 3A:
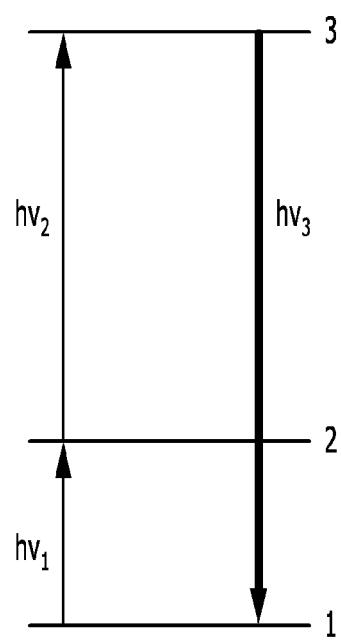
FIG. 3A illustrates wavelength conversion of an anti-Stokes material included in a wavelength converter of an infrared image sensor according to an exemplary embodiment.
Figure 3B:
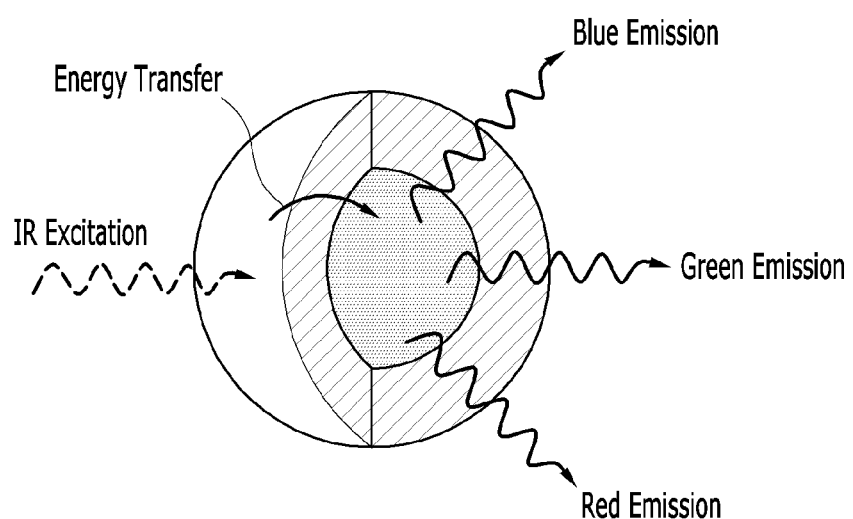
FIG. 3B illustrates wavelength conversion of anti-Stokes nanoparticles included in a wavelength converter of an infrared image sensor according to an exemplary embodiment.

FIG. 2 schematically illustrates a cross-section of an infrared image sensor according to an exemplary embodiment, FIG. 3A illustrates wavelength conversion of an anti-Stokes material included in a wavelength converter of an infrared image sensor according to an exemplary embodiment, and FIG. 3B illustrates wavelength conversion of anti-Stokes nanoparticles included in a wavelength converter of an infrared image sensor according to an exemplary embodiment.

Referring to FIG. 2 to FIG. 3B, the infrared image sensor 100 includes a wavelength converter 150 which is disposed at each of the sensor pixels SPXL defined by allowing the scan lines and the data lead-out lines on the surface of the substrate 102 to cross each other, and absorbs infrared rays IR emitted from the outside to convert them into visible rays VR and discharge them. The infrared image sensor 100 includes the photosensor part 130 which is disposed at each of the sensor pixels SPXL to sense the visible rays VR converted by the wavelength converter 150.

Herein, the wavelength converter 150 includes an anti-Stokes material. The wavelength converter 150 may have a thin-film shape. The anti-Stokes material is a material that absorbs the infrared rays IR and performs anti-Stokes' shift for converting them into light of a band of the visible rays VR when excited. The anti-Stokes shift is performed when the energy of emitted photons is greater than the energy of absorbed photons (up conversion luminescence) (see FIG. 3A).

For example, the anti-Stokes material may convert the infrared rays IR into blue light having a wavelength range of about 440 nm to about 500 nm (blue emission). The anti-Stokes material may convert the infrared rays IR into green light having a wavelength range of about 520 nm to about 570 nm (green emission). The anti-Stokes material may convert the infrared rays IR into blue light having a wavelength range of about 630 nm to about 700 nm (red emission).

The anti-Stokes material may have a form of a plurality of anti-Stokes nanoparticles (not shown) having a nano-scale size (see FIG. 3B). Herein, as an average particle diameter of the anti-Stokes nanoparticles (not illustrated) increases, a wavelength of the visible rays converted and emitted by the wavelength converter 150 may become longer. Accordingly, it can be adjusted to a visible ray wavelength most suitable for a semiconductor material contained in the photosensor portion 130, by adjusting the average particle diameter of the anti-Stokes nanoparticles (not shown).

The wavelength converter 150 may be disposed on a movement path of the infrared rays in the infrared image sensor 100. For example, the wavelength converter 150 may be disposed above or below the photosensor part 130, and may be disposed inside the photosensor part 130. This will be described in detail with reference to FIG. 4A to FIG. 6B.

The photosensor part 130 acquires an image by sensing the visible rays VR. The photosensor part 130 transmits the infrared rays IR as they are, and generates current signals by absorbing the visible ray VR.

A band gap of semiconductor materials included in the photosensor part 130 which senses light having a wavelength band of visible rays VR may be greater than that of semiconductor materials included in a conventional infrared image sensor to absorb light having a wavelength band of the infrared rays IR. Therefore, according to the exemplary embodiments, the image sensor 100 can minimize generation of thermally excited electrons and minimize occurrence of a dark current, thereby improving visibility of the acquired image.

Figure 4A:
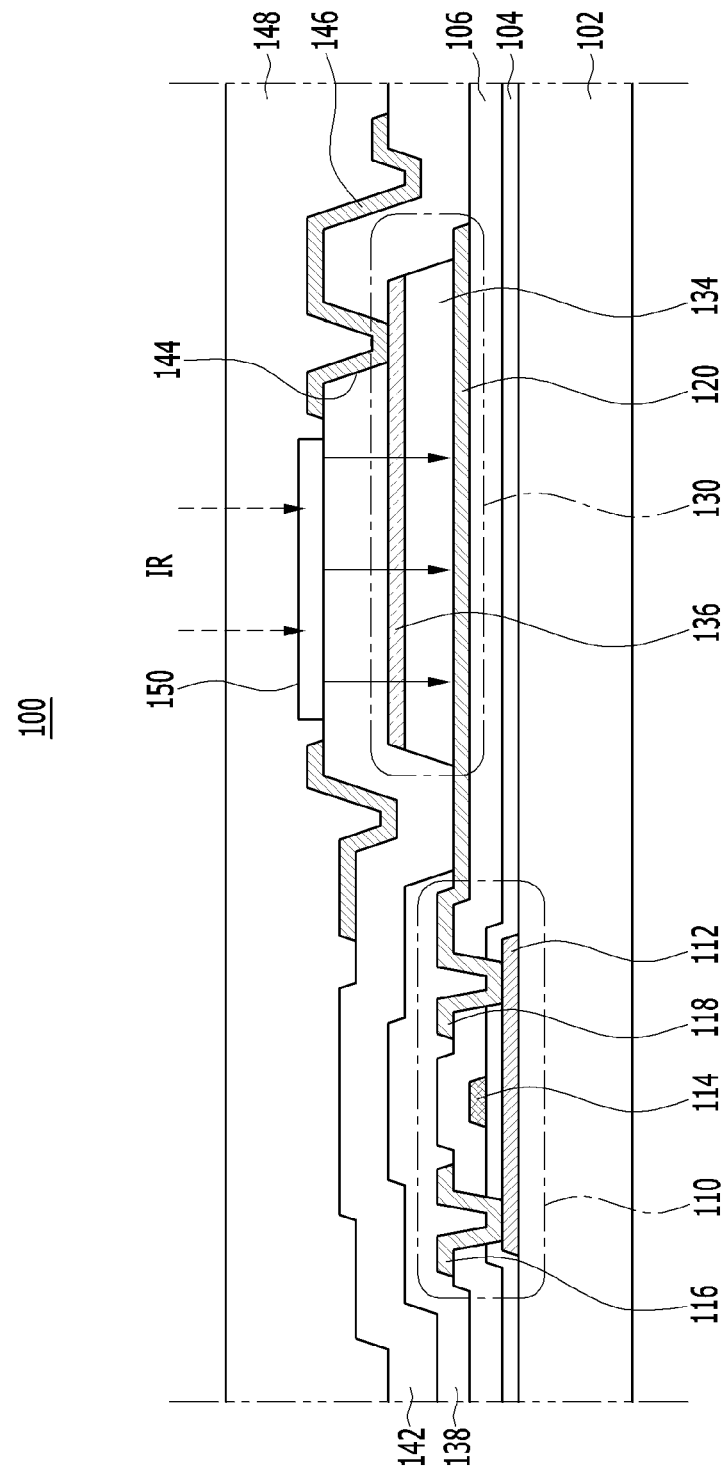
FIG. 4A illustrates a cross-section of an infrared image sensor according to an exemplary embodiment.

FIG. 4A illustrates a cross-section of an infrared image sensor according to an exemplary embodiment. As an example, one sensor pixel SPXL is illustrated.

Referring to FIG. 4A, the infrared image sensor 100 includes the photosensor part 130, the wavelength converter 150, and the thin film transistor 110 disposed on a first surface of the substrate 102.

In this specification and the drawings, the first surface of the substrate 102 indicates an upper surface of the substrate 102, and a second surface of the substrate 102 indicates a lower surface of the substrate 102.

The thin film transistor 110 may be electrically connected to the scan lines SL1 to SLn and the data lead-out lines DL1 to DLm to switch the sensor pixels SPXL.

The thin film transistor 110 includes a channel layer 112, a gate electrode 114, a source electrode 116, and a drain electrode 118. A gate insulating layer 104 is disposed between the channel layer 112 and the gate electrode 114, and a first insulating layer 106 is disposed on the gate electrode 114. The source electrode 116 and the drain electrode 118 are disposed on the first insulating layer 106 to contact the channel layer 112 through contact holes.

Hereinafter, a left electrode and a right electrode of the source electrode 116 and the drain electrode 118 have respectively been described as the source electrode 116 and the drain electrode 118, but may be the drain electrode 118 and the source electrode 116, respectively.

In addition, the thin film transistor 110 illustrated in the present specification may merely be an example, but the present invention is not limited thereto. The thin film transistor 110 may be designed in various structures. For example, thin film transistor 110 may have one of a co-planar structure, a staggered structure, an inverted co-planar structure, and an inverted staggered structure.

The channel layer 112 may contain low temperature polycrystalline silicon (LTPS), amorphous silicon (a-Si), an oxide, or the like.

The photosensor part 130 includes a first electrode 120 and a second electrode 136 which are separately disposed to face each other, and a semiconductor layer 134 disposed between the first electrode 120 and the second electrode 136.

Herein, the semiconductor layer 134 may transmit the infrared rays IR as they are or may absorb the visible rays VR. For example, the semiconductor layer 134 may include amorphous silicon (a-Si), polysilicon, a group III-V semiconductor material, a group II-VI semiconductor material, a group III-V ternary semiconductor material, a group II-VI ternary semiconductor material, copper indium gallium selenide (CIGS), an organic material, or quantum dots. In this case, the group III-V semiconductor material may include at least one of GaN and GaAs, the group II-VI semiconductor material may include at least one of CdS, ZnS, CdTe, and HgTe, the group III-V ternary semiconductor material may include InGaAs, and the group II-VI ternary semiconductor material may include HgCdTe. When such semiconductor materials are employed, it is possible not only to further minimize the dark current and but also to more improve the image visibility. In the case of an organic material, any material may be used without limitation when it can absorb light having a wavelength band of visible rays.

The first electrode 120 of the photosensor part 130 illustrated in FIG. 4A may be a portion formed by allowing the drain electrode 118 of the thin film transistor 110 to extend, and the first electrode 118, the semiconductor layer 134, and the second electrode 136 may be overlapped with each other. The first electrode 120 may include an opaque material.

The second electrode 136 of the photosensor part 130 may include a transparent material. For example, the second electrode 136 may include a transparent conductive oxide such as indium tin oxide (ITO).

The first electrode 120 and the second electrode 136 constitute a capacitor to store charges generated in the semiconductor layer 134.

A second insulating layer 138, the photosensor part 130 including the first electrode formed by allowing the drain electrode 118 to extend, and a third insulating layer 142 which covers the second insulating layer 138 and the photosensor part 130 are disposed on the source electrode 116 and the drain electrode 118 of the thin film transistor 110.

According to the present exemplary embodiment, the infrared image sensor 100 may be disposed on the second electrode 136 of each photosensor part 130, and may further include a third electrode 146 connected with the second electrode 136 through a first contact hole 144. For example, a third insulating layer 142 is disposed between the second electrode 136 and the third electrode 146 of the photosensor part 130, and the second electrode 136 and the third electrode 146 are electrically connected to each other through the first contact hole 144. Herein, the third electrode 146 may serve as a bias electrode for applying a bias to the photosensor part 130.

The wavelength converter 150 may be disposed on an internal movement path of infrared rays emitted from the outside, e.g., may be disposed at a same layer as the third electrode 146, and may overlap the semiconductor layer 134.

When infrared rays may be emitted from an upper portion of the third electrode 146 (upper side in the drawing), the infrared rays may be absorbed into the wavelength converter 150, and then may be converted into visible rays to be emitted in a direction of the photosensor part 130. In addition, the emitted visible rays may pass through the transparent second electrode 136 and may reach the semiconductor layer 134.

The semiconductor layer 134 may transmit the infrared rays IR, and may generate current signals by only absorbing the visible rays VR. Accordingly, the visible rays may be absorbed into the semiconductor layer 134 to produce charges. Therefore, generation of thermally excited electrons may be minimized, and dark currents may be minimized to improve the image visibility.

Herein, the wavelength converter 150 may have a thin-film form including an anti-Stokes material. In this case, the wavelength converter 150 may be formed by being coated on the third insulating layer 142 by a method, e.g., a spin coating method.

In addition, the wavelength converter 150 may include a plurality of anti-Stokes nanoparticles (not illustrated), and the anti-Stokes nanoparticles may be uniformly dispersed in the wavelength converter 150. For example, the anti-Stokes nanoparticles may be uniformly mixed with a polymer resin, and then may be coated by a method such as a spin coating method.

When the anti-Stokes material is formed of the anti-Stokes nanoparticles, as the average particle diameter of the anti-Stokes nanoparticles increases, the wavelength of the visible rays converted and emitted from the wavelength converter 150 may become longer. Accordingly, the wavelength of the visible rays can be controlled by adjusting the average particle diameter of the nanoparticles.

The wavelength converter 150 and a planarization layer 148 which covers the third electrode 146 may be disposed on the wavelength converter 150.

For example, the infrared image sensor 100 may be a constituent element of an infrared camera (not illustrated). In this case, the infrared rays may be emitted from an upper portion of the planarization layer 148 to be converted into visible rays by the wavelength converter 150.

Although not illustrated, the wavelength converter 150 may further include a down-conversion material which absorbs ultraviolet rays and converts them into visible rays to emit them. Herein, in the case of the down-conversion material, energy of emitted photons is smaller than that of absorbed photons (down-conversion luminescence). In this case, although the ultraviolet rays are introduced into the infrared image sensor 100, they may be recognized. The anti-Stokes material and the down-conversion material may independently perform wavelength conversion without affecting each other.

The down-conversion material may include a plurality of down-conversion nanoparticles, and the down-conversion nanoparticles may be uniformly dispersed in the wavelength converter.

Hereinafter, description of the same configuration as that described in FIG. 4A may be omitted.

Figure 4B:
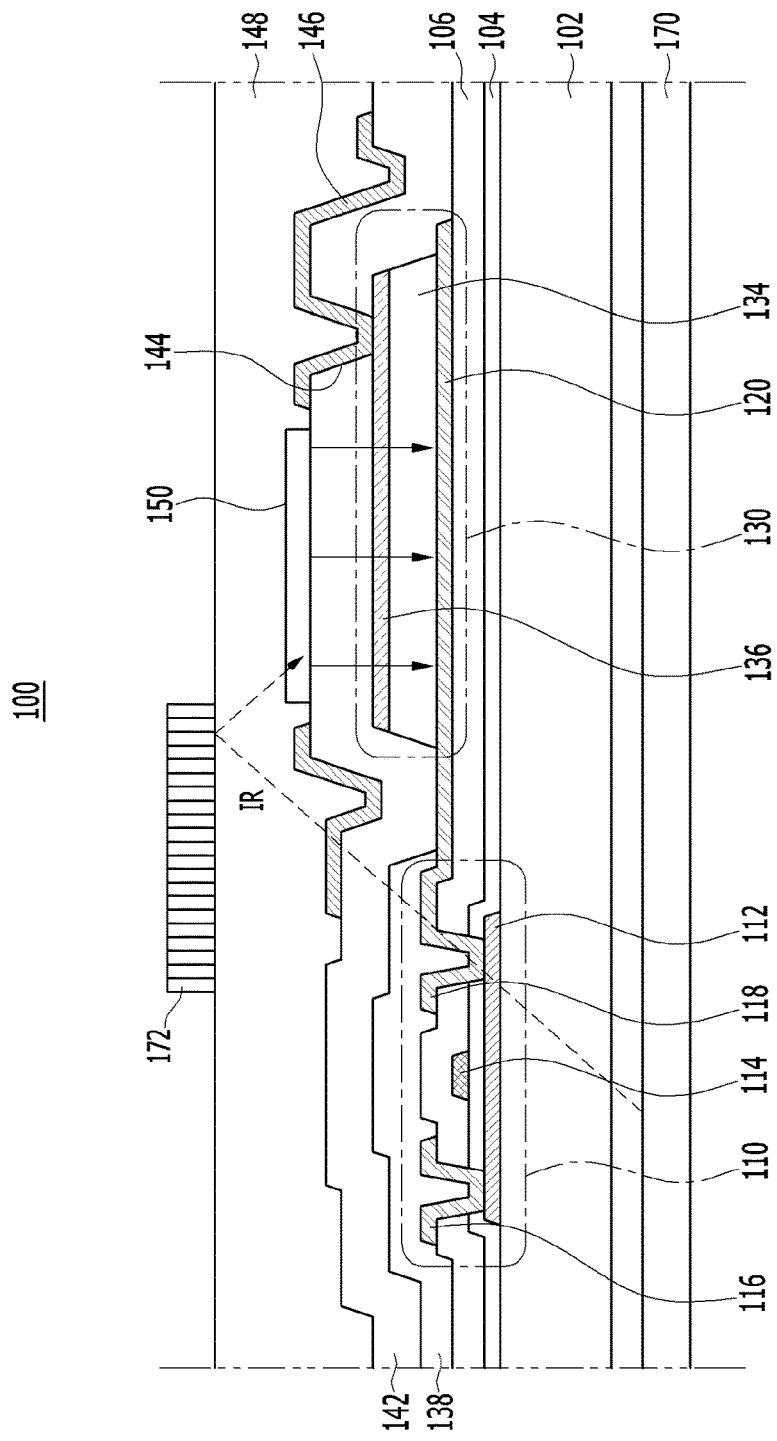
FIG. 4B illustrates a cross-section of an infrared image sensor according to an exemplary embodiment.

FIG. 4B illustrates a cross-section of an infrared image sensor according to an exemplary embodiment. As an example, one sensor pixel SPXL is illustrated.

Referring to FIG. 4B, the infrared image sensor 100 includes the photosensor part 130, the wavelength converter 150, and the thin film transistor 110 disposed on a first surface of the substrate 102. For example, the infrared image sensor 100 may be a constituent element of a scanner device (not illustrated).

In addition, the infrared image sensor 100 may be disposed on a second surface of the substrate 102, and may further include a backlight unit 170 for emitting the infrared rays IR into an object 172.

In this case, the photosensor part 130 and the wavelength converter 150 may be disposed between the backlight unit 170 and the object 172, and infrared rays emitted from the backlight unit 170 may be reflected by the object 172 to be emitted into the wavelength converter 150.

The object 172 disposed on the planarization layer 148 may be, e.g., a passport as a target object to be emitted for reflecting infrared rays.

The wavelength converter 150 may be disposed at a same layer as the third electrode 146, the infrared rays reflected by the object 172 may be converted into visible rays by the wavelength converter 150, and the converted visible rays may be absorbed into the semiconductor layer 134 of the photosensor part 130.

A configuration of the infrared image sensor 100 of FIG. 4B including the thin film transistor 110, the wavelength converter 150, the photosensor part 130, and the like is the same as that of the infrared image sensor 100 of FIG. 4A.

Figure 5A:
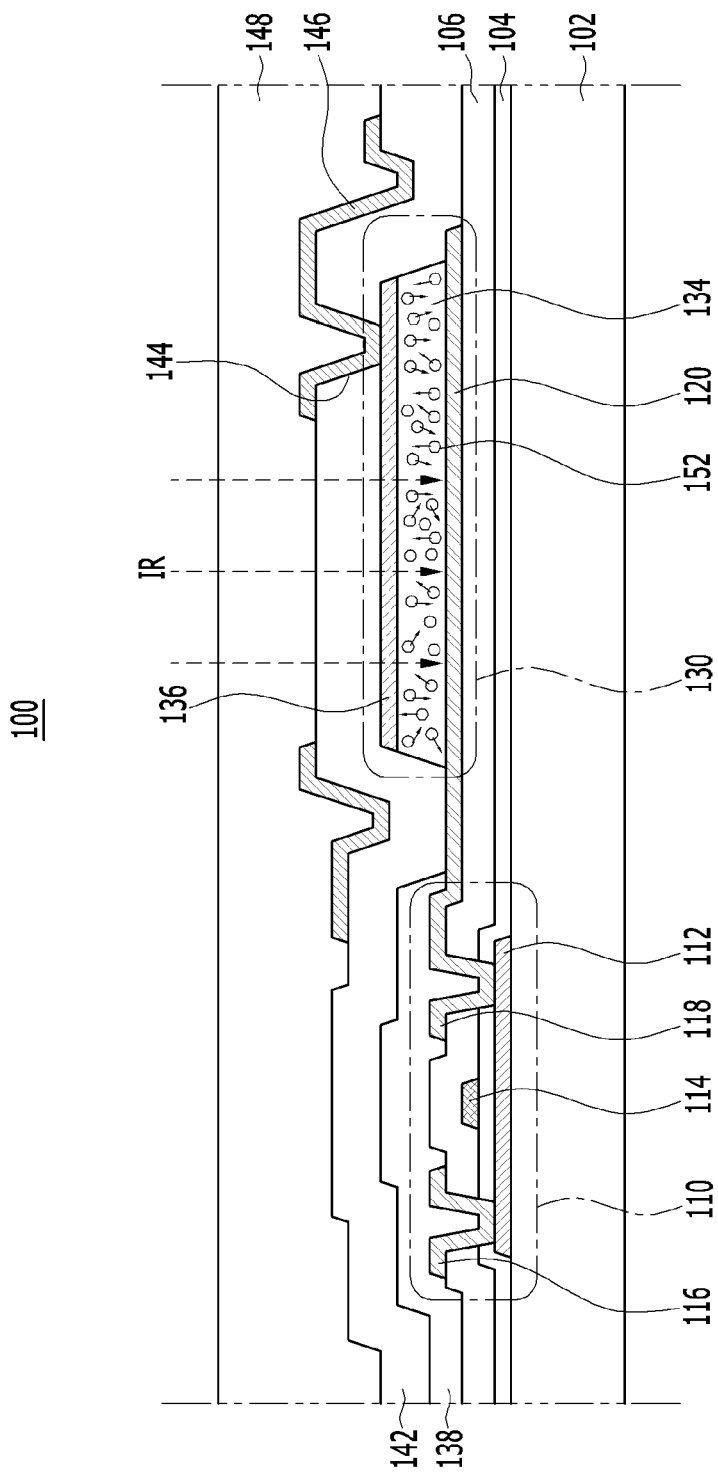
FIG. 5A illustrates a cross-section of an infrared image sensor according to an exemplary embodiment.
Figure 5B:
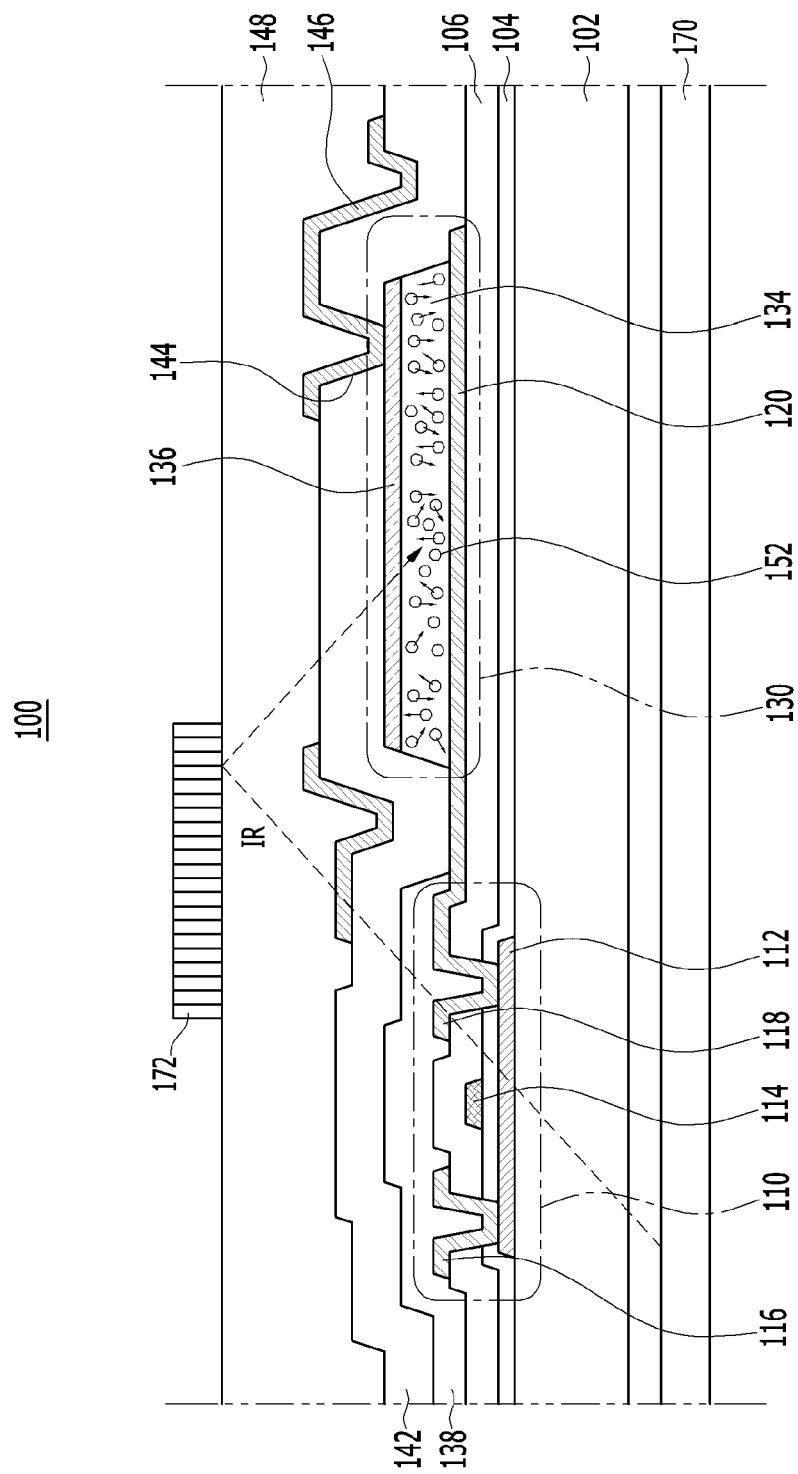
FIG. 5B illustrates a cross-section of an infrared image sensor according to an exemplary embodiment.
Figure 6B:
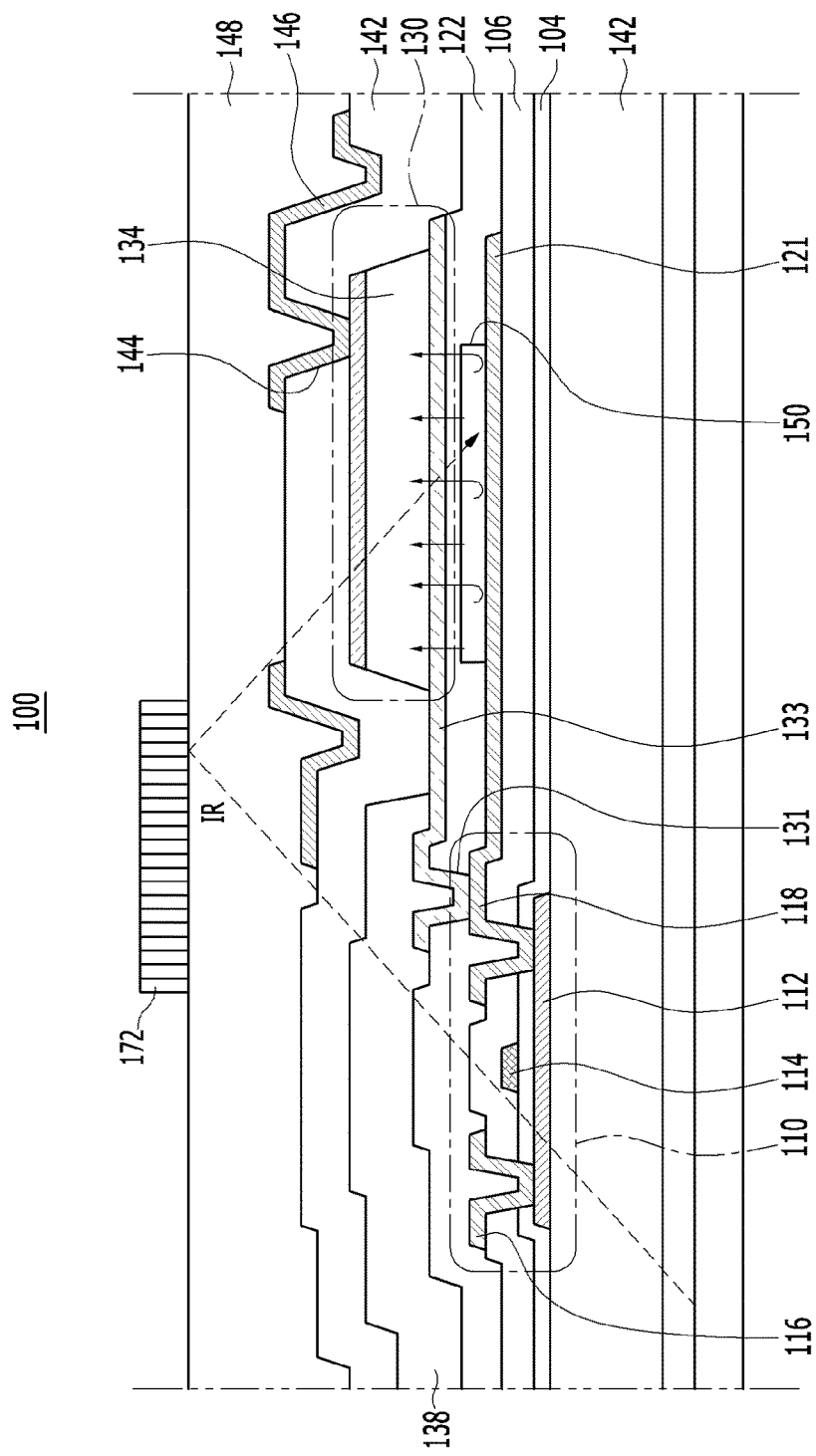
FIG. 6B illustrates a cross-section of an infrared image sensor according to an exemplary embodiment.

Although a path in which light emitted from the backlight unit 170 passes through the thin film transistor 110 is illustrated in FIG. 4B, FIG. 5B, and FIG. 6b for convenience of description, the light emitted from the backlight unit 170 may pass through a region in which no electrodes 112, 114, 116, and 118 of the thin film transistor 110 are disposed, to be reflected by the object 172.

FIG. 5A illustrates a cross-section of an infrared image sensor according to an exemplary embodiment. Herein, the infrared image sensor 100 may be a constituent element of an infrared camera (not illustrated).

Referring to FIG. 5A, the infrared image sensor 100 includes the photosensor part 130 and the wavelength converter 150 disposed on a first surface of the substrate 102.

The thin film transistor 110 includes a channel layer 112, a gate electrode 114, a source electrode 116, and a drain electrode 118. A gate insulating layer 104 is disposed between the channel layer 112 and the gate electrode 114, and a first insulating layer 106 is disposed on the gate electrode 114. The source electrode 116 and the drain electrode 118 are disposed on the first insulating layer 106 to contact the channel layer 112 through contact holes.

The photosensor part 130 includes a first electrode 120 and a second electrode 136 which are separately disposed to face each other, and a semiconductor layer 134 disposed between the first electrode 120 and the second electrode 136.

Herein, the semiconductor layer 134 may transmit the infrared rays IR as they are or may absorb the visible rays VR. In the infrared image sensor 100 of FIG. 5A, the semiconductor layer 134 may include a group III-V semiconductor material, a group II-VI semiconductor material, CIGS, an organic material, or quantum dots.

The first electrode 120 may be a portion formed by allowing the drain electrode 118 of the thin film transistor 110 to extend, and the first electrode 118, the semiconductor layer 134, and the second electrode 136 may be overlapped with each other. The first electrode 120 may include an opaque material.

The second electrode 136 of the photosensor part 130 may include a transparent material such as ITO.

A second insulating layer 138, the photosensor part 130 including the first electrode formed by allowing the drain electrode 118 to extend, a third insulating layer 142 which covers the second insulating layer 138, and the photosensor part 130 are disposed on the source electrode 116 and the drain electrode 118 of the thin film transistor 110.

In the infrared image sensor 100 of the present exemplary embodiment, the wavelength converter 150 may be disposed on an internal movement path of infrared rays emitted from the outside, that is, may be disposed inside the semiconductor layer 134, for example. Therefore, the semiconductor layer 134 may also serve as the wavelength converter 150 in the infrared image sensor 100 illustrated in FIG. 5A. The anti-Stokes material may include a plurality of anti-Stokes nanoparticles 152, and may have a shape in which the anti-Stokes nanoparticles 152 are uniformly dispersed in the semiconductor layer 134.

When the anti-Stokes material is disposed inside the semiconductor layer 134, the semiconductor material included in the semiconductor layer 134 may be an organic material or quantum dots.

Although not illustrated, the semiconductor layer 134 may further include a plurality of down-conversion nanoparticles, and the down-conversion nanoparticles may be uniformly dispersed inside the semiconductor layer 134. In this case, the down-conversion nanoparticles and the anti-Stokes nanoparticles may not affect each other.

When infrared rays may be emitted from an upper portion of the third electrode 146 (upper side in the drawing), the infrared rays may pass through the transparent second electrode 136 and may reach the semiconductor layer 134.

According to an exemplary embodiment, the semiconductor layer 134 may simultaneously serve as the wavelength converter 150. The infrared rays which reach the semiconductor layer 134 may be converted into visible rays by the anti-Stokes nanoparticles 152 inside the semiconductor layer 134, and the visible rays may be absorbed into the organic material or the quantum dot material, thereby generating charges.

A planarization layer 148 may be disposed on the third electrode 146.

For example, the infrared image sensor 100 may be a constituent element of an infrared camera. In this case, the infrared rays may be emitted from an upper portion of the planarization layer 148, and may be converted into visible rays by the wavelength converter 150.

FIG. 5B illustrates a cross-section of an infrared image sensor according to an exemplary embodiment. For example, one sensor pixel SPXL is illustrated. Herein, the infrared image sensor 100 may be a constituent element of a scanner device, for example.

Referring to FIG. 5B, the infrared image sensor 100 includes the photosensor part 130, the wavelength converter 150, and the thin film transistor 110 disposed on a first surface of the substrate 102.

In addition, the infrared image sensor 100 may be disposed on a second surface of the substrate 102, and may further include a backlight unit 170 for emitting the infrared rays IR to an object 172.

In this case, the photosensor part 130 may be disposed between the backlight unit 170 and the object 172, and infrared rays emitted from the backlight unit 170 may be reflected by the object 172 to be converted into visible rays by the anti-Stokes nanoparticles 152 of the semiconductor layer 134.

The object 172 disposed on the planarization layer 148 may be, e.g., a passport as a target object to be emitted for reflecting infrared rays.

The visible rays converted by the anti-Stokes nanoparticles 152 inside the semiconductor layer 134 may be absorbed into the organic material or the quantum dots constituting the semiconductor layer 134 of the photosensor part 130.

A configuration of the infrared image sensor 100 of FIG. 5B including the thin film transistor 110, the photosensor part 130, and the like is the same as that of the infrared image sensor 100 of FIG. 5A.

FIG. 6A illustrates a cross-section of an infrared image sensor according to an exemplary embodiment. Herein, the infrared image sensor 100 may be a constituent element of an infrared camera (not illustrated).

Referring to FIG. 6A, the infrared image sensor 100 includes the photosensor part 130, the wavelength converter 150, and the thin film transistor 110 disposed on a first surface of the substrate 102.

The photosensor part 130 includes a first electrode 133 and a second electrode 136 separately disposed to face each other, and a semiconductor layer 134 disposed between the first electrode 133 and the second electrode 136.

Herein, the first electrode 133 is disposed on the drain electrode 118 of the thin film transistor 110, and the first electrode 133 is connected with the drain electrode 118 of the thin film transistor 110 through a second contact hole 131.

Each of the first electrode 133 and the second electrode 136 may include a transparent material, e.g., a TCO material such as ITO.

The infrared image sensor 100 may be formed by allowing the drain electrode 118 of the thin film transistor 110 to extend, and may further include a reflection electrode 121 including an opaque material. In the exemplary embodiments of FIG. 4A to FIG. 5B, a portion formed by allowing the drain electrode 118 of the thin film transistor 110 to extend serves as an electrode of the photosensor part 130. However, in the exemplary embodiment of FIG. 6A, the portion may serve as the reflection electrode 121.

The wavelength converter 150 may be disposed on an internal movement path of infrared rays emitted from the outside, e.g., may be disposed between the reflection electrode 121 and the first electrode 133. Herein, the wavelength converter 150 may overlap the semiconductor layer 134, and a fourth insulating layer 122 may be disposed between the wavelength converter 150 and the first electrode 133.

In this case, the wavelength converter 150 may have a thin-film form including an anti-Stokes material. The wavelength converter 150 may be disposed on the reflection electrode 121 by using a method such as a spin coating method.

In addition, the anti-Stokes material may include a plurality of anti-Stokes nanoparticles (not illustrated), and the anti-Stokes nanoparticles may be uniformly dispersed in the wavelength converter 150. For example, the wavelength converter 150 may be formed by uniformly mixing the anti-Stokes nanoparticles in a polymer resin and then coating it on the reflection electrode 121 by using a method such as a spin coating method.

Although not illustrated, the wavelength converter 150 may further include a down-conversion material, and the down-conversion material and the anti-Stokes material may not affect each other.

When infrared rays may be emitted from an upper portion of the third electrode 146 (upper side in the drawing), the infrared rays may pass through the transparent second electrode 136, the semiconductor layer 134, and the transparent first electrode 133 as they are and may reach the wavelength converter 150. The infrared rays may be converted into visible rays by the wavelength converter 150, and some of the converted visible rays may pass through the first electrode 133 to be introduced into the semiconductor layer 134. In addition, some of the converted visible rays may be reflected by the reflection electrode 121 to pass through the first electrode 133 and to be introduced into the semiconductor layer 134. Efficiency of using infrared rays can be improved by the action of the reflective electrode 121

The semiconductor layer 134 passes the infrared rays IR therethrough and includes a material for only absorbing the visible rays VR, and thus the visible rays may be absorbed into the semiconductor layer 134, thereby generating charges. Therefore, generation of thermally excited electrons may be minimized, and dark currents may be minimized to improve the image visibility.

FIG. 6B illustrates a cross-section of an infrared image sensor according to an exemplary embodiment. For example, one sensor pixel SPXL is illustrated. Herein, the infrared image sensor 100 may be a constituent element of a scanner device, for example.

Referring to FIG. 6B, the infrared image sensor 100 includes the photosensor part 130, the wavelength converter 150, and the thin film transistor 110 disposed on a first surface of the substrate 102.

In addition, the infrared image sensor 100 may be disposed on a second surface of the substrate 102, and may further include a backlight unit 170 for emitting the infrared rays IR to an object 172.

In this case, the photosensor part 130 may be disposed between the backlight unit 170 and the object 172, and infrared rays emitted from the backlight unit 170 may be reflected by the object 172 to pass through the photosensor part 130 and to reach the wavelength converter 150. The visible rays converted in the wavelength converter 150 may be introduced and absorbed into the semiconductor layer 134 of the photosensor part 130.

The object 172 disposed on the planarization layer 148 may be, e.g., a passport as a target object to be emitted for reflecting infrared rays.

A configuration of the infrared image sensor 100 of FIG. 6B including the thin film transistor 110, the photosensor part 130, the wavelength converter 150, and the like is the same as that of the infrared image sensor 100 of FIG. 6A In brief, according to the exemplary embodiments, the infrared image sensor 100 may minimize generation of thermally excited electrons by converting infrared rays into visible rays and using a semiconductor material that is operated in a wavelength band of visible rays, and thus dark currents may be minimized to improve the visibility of an acquired image and the image sensor 100 may be operated without using an additional cooling process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An infrared image sensor comprising:
    a sensor pixel connected with a data lead-out line and a scan line disposed on a surface of a substrate;
    a wavelength converter positioned in the sensor pixel and disposed in an internal movement path of infrared rays, including an anti-Stokes material that absorbs infrared rays and converts them into visible rays to emit them; and
    a photosensor part positioned in the sensor pixel to sense the visible rays converted by the wavelength converter, wherein the photosensor part includes:
    a first electrode and a second electrode separately disposed to face each other; and
    a semiconductor layer disposed between the first electrode and the second electrode to transmit infrared rays and absorb visible rays.

2. The infrared image sensor of claim 1, further comprising
a thin film transistor connected to the scan line and the data lead-out line to transfer current signals depending on charge generation of the photosensor part to the data lead-out line.

3. The infrared image sensor of claim 2, wherein the first electrode is formed by allowing a source electrode or a drain electrode of the thin film transistor to extend.

4. The infrared image sensor of claim 3, wherein the second electrode includes a transparent material.

5. The infrared image sensor of claim 3, further comprising
a third electrode positioned on the second electrode of the photosensor part to be connected with the second electrode through a contact hole,
wherein the wavelength converter is positioned at a same layer as the third electrode, and the wavelength converter overlaps the semiconductor layer.

6. The infrared image sensor of claim 5, wherein the anti-Stokes material includes a plurality of anti-Stokes nanoparticles, and the anti-Stokes nanoparticles are uniformly dispersed inside the wavelength converter.

7. The infrared image sensor of claim 3, wherein the wavelength converter is positioned in the semiconductor layer,
the anti-Stokes material includes a plurality of anti-Stokes nanoparticles, and the anti-Stokes nanoparticles are uniformly dispersed inside the semiconductor layer.

8. The infrared image sensor of claim 2, wherein the first electrode is disposed on a source electrode or a drain electrode of the thin film transistor, and
the first electrode is connected with the source electrode or the drain electrode of the thin film transistor through a contact hole.

9. The infrared image sensor of claim 8, wherein each of the first electrode and the second electrode includes a transparent material.

10. The infrared image sensor of claim 8, further comprising
a reflection electrode formed by allowing the source electrode or the drain electrode of the thin film transistor to extend,
wherein the wavelength converter is positioned between the reflection electrode and the first electrode, and the wavelength converter overlaps the semiconductor layer.

11. The infrared image sensor of claim 10, wherein the anti-Stokes material includes a plurality of anti-Stokes nanoparticles, and the anti-Stokes nanoparticles are uniformly dispersed inside the wavelength converter.

12. The infrared image sensor of claim 11, wherein some of visible rays emitted from the wavelength converter are reflected by the reflection electrode to be introduced into the semiconductor layer.

13. The infrared image sensor of claim 1, wherein the wavelength converter further includes a down-conversion material for absorbing ultraviolet rays, converting them into visible rays, and emitting them.

14. The infrared image sensor of claim 13, wherein the down-conversion material includes a plurality of down-conversion nanoparticles, and the down-conversion nanoparticles are uniformly dispersed inside the wavelength converter.

15. The infrared image sensor of claim 1, wherein the semiconductor layer includes an amorphous silicon (a-Si), a polysilicon, a group III-V semiconductor material, a group II-VI semiconductor material, a group III-V ternary semiconductor material, a group II-VI ternary semiconductor material, copper indium gallium selenide (CIGS), an organic material, or quantum dots.

16. The infrared image sensor of claim 15, wherein the group III-V semiconductor material includes at least one of GaN and GaAs, the group II-VI semiconductor material includes at least one of CdS, ZnS, CdTe, and HgTe, the group III-V ternary semiconductor material includes InGaAs, and the group II-VI ternary semiconductor material includes HgCdTe.

17. The infrared image sensor of claim 2, further comprising
a backlight unit positioned on a second surface of the substrate to emit infrared rays to an object,
wherein the photosensor part and the wavelength converter are positioned between the backlight unit and the object, and
the infrared rays are reflected in the object to be emitted to the wavelength converter.

18. The infrared image sensor of claim 2, wherein the thin film transistor has one of a co-planar structure, a staggered structure, an inverted co-planar structure, and an inverted staggered structure.

19. The infrared image sensor of claim 18, wherein a channel layer of the thin film transistor includes a low temperature polycrystalline silicon (LTPS), an amorphous silicon (a-Si), or an oxide.

20. The infrared image sensor of claim 2, further comprising:
a scan line driver configured to drive the scan line; and
a lead-out controller configured to supply a current signal of the photosensor to a lead-out driver through the data lead-out line.

* * * * *